US006653193B2

(12) United States Patent
Gilton (10) Patent No.: US 6,653,193 B2
(45) Date of Patent: Nov. 25, 2003

(54) RESISTANCE VARIABLE DEVICE (75) Inventor: Terry L. Gilton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 153 days.

(21) Appl. No.: 09/732,968

(22) Filed: Dec. 8, 2000

(65) Prior Publication Data

US 2002/0072188 A1 Jun. 13, 2002

(51) Int. Cl.$^7$ ............................................. H01L 21/336
(52) U.S. Cl. ..................... 438/286; 438/330; 438/382
(58) Field of Search ................................ 438/286, 382, 438/330

(56) References Cited

U.S. PATENT DOCUMENTS

| | | | |
|---|---|---|---|
| 3,622,319 A | 11/1971 | Sharp | 96/27 |
| 3,743,847 A | 7/1973 | Boland | 250/510 |
| 4,269,935 A | 5/1981 | Masters et al. | 430/323 |
| 4,312,938 A | 1/1982 | Drexler et al. | 430/496 |
| 4,320,191 A | 3/1982 | Yoshikawa et al. | 430/296 |
| 4,405,710 A | 9/1983 | Balasubramanyam et al. | 430/311 |
| 4,419,421 A | 12/1983 | Wichelhaus et al. | 429/191 |
| 4,499,557 A | 2/1985 | Holmberg et al. | 365/163 |
| 4,795,657 A | 1/1989 | Formigoni et al. | 427/96 |
| 4,847,674 A | 7/1989 | Silwa et al. | 357/67 |
| 5,177,567 A | 1/1993 | Klersy et al. | 257/4 |
| 5,219,788 A | 6/1993 | Abernathey et al. | 437/187 |
| 5,238,862 A | 8/1993 | Blalock et al. | 437/52 |
| 5,315,131 A | 5/1994 | Kishimoto et al. | 257/57 |
| 5,350,484 A | 9/1994 | Gardner et al. | 156/628 |
| 5,360,981 A | 11/1994 | Owen et al. | 257/4 |
| 5,500,532 A | 3/1996 | Kozicki et al. | |
| 5,512,328 A | 4/1996 | Yoshimura et al. | 427/498 |
| 5,512,773 A | 4/1996 | Wolf et al. | 257/471 |
| 5,726,083 A | 3/1998 | Takaishi | 438/210 |

(List continued on next page.)

FOREIGN PATENT DOCUMENTS

| | | |
|---|---|---|
| JP | 56126916 A | 10/1981 |
| WO | WO 97/48032 | 12/1997 |
| WO | WO 99/28914 | 6/1999 |
| WO | 00/48196 A1 | 8/2000 |
| WO | WO 02/21542 | 3/2002 |
| WO | 02/21542 A1 | 3/2002 |

OTHER PUBLICATIONS

K. Shimakawa et al., Photoinduced effects and metastability in amorphous semiconductors and insulators, 44 Advances in Physics, No. 6, 475–588 (1995).

Thornburg, D.D.; White, R.M., Electric field enhanced phase separation and memory switching in amorphous arsenic triselenide, Journal(??) (1972) 4609–4612.

(List continued on next page.)

Primary Examiner—Michael S. Lebentritt
Assistant Examiner—Pho Luu
(74) Attorney, Agent, or Firm—Dickstein Shapiro Morin & Oshinsky LLP (57) ABSTRACT A resistance variable device and a method for using the same. The device includes a body formed of a voltage or current controlled resistance setable material, and at least two spaced electrodes on the body. The body includes a surface extending from one of the electrodes to the other of the electrodes. The surface has at least one surface striation extending from proximate the one electrode to proximate the other electrode at least when the body of said material is in a highest of selected resistance setable states. The method includes applying a first voltage between the one and the other electrodes to establish a negative and a positive electrode effective to form a conductive path formed of at least some material derived from the voltage or current controlled resistance setable material and on the surface along at least a portion of the at least one striation.

51 Claims, 5 Drawing Sheets

U.S. PATENT DOCUMENTS

| | | | |
|---|---|---|---|
| 5,751,012 A | 5/1998 | Wolstenholme et al. ........ 257/5 |
| 5,761,115 A | 6/1998 | Kozicki et al. ............. 365/182 |
| 5,789,277 A | 8/1998 | Zahorik et al. ............... 438/95 |
| 5,841,150 A | 11/1998 | Gonzalez et al. .............. 257/3 |
| 5,846,889 A | 12/1998 | Harbison et al. ............. 401/40 |
| 5,896,312 A | 4/1999 | Kozicki et al. ............. 365/153 |
| 5,914,893 A | 6/1999 | Kozicki et al. ............. 365/107 |
| 5,920,788 A | 7/1999 | Reinberg .................... 438/466 |
| 5,998,066 A | 12/1999 | Block et al. .................... 430/5 |
| 6,077,729 A | 6/2000 | Harshfield .................. 438/128 |
| 6,084,796 A | 7/2000 | Kozicki et al. ............. 365/153 |
| 6,117,720 A | 9/2000 | Harshfield .................. 438/238 |
| 6,143,604 A | 11/2000 | Chiang et al. .............. 438/253 |
| 6,177,338 B1 | 1/2001 | Liaw et al. ................. 438/629 |
| 6,232,648 B1 * | 5/2001 | Wu ............................ 257/534 |
| 6,236,059 B1 | 5/2001 | Wolstenholme et al. ....... 257/3 |
| 6,297,170 B1 | 10/2001 | Gabriel et al. .............. 438/738 |
| 6,300,684 B1 | 10/2001 | Gonzalez et al. ........... 257/774 |
| 6,316,784 B1 | 11/2001 | Zahorik et al. ................ 257/3 |
| 6,329,606 B1 | 12/2001 | Freyman et al. ............ 174/260 |
| 6,348,365 B1 | 2/2002 | Moore et al. ............... 438/365 |
| 6,350,679 B1 | 2/2002 | McDaniel et al. .......... 438/634 |
| 6,376,284 B1 | 4/2002 | Gonzalez et al. ........... 438/129 |
| 6,388,324 B2 | 5/2002 | Kozicki et al. |
| 6,391,688 B1 | 5/2002 | Gonzalez et al. ........... 438/128 |
| 6,410,397 B1 * | 6/2002 | Ochiai et al. ............... 438/381 |
| 6,414,376 B1 | 7/2002 | Thakur et al. .............. 257/640 |
| 6,418,049 B1 | 7/2002 | Kozicki et al. ............. 365/174 |
| 6,423,628 B1 | 7/2002 | Li et al. ..................... 438/622 |
| 6,469,364 B1 | 10/2002 | Kozicki |
| 2002/0000666 A1 | 1/2002 | Kozicki et al. |
| 2002/0168820 A1 | 11/2002 | Kozicki et al. |

OTHER PUBLICATIONS

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992) 471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Hirose, et al., "High Speed Memory Behavior and Reliability of an Amorphous $As_2S_3$ Film Doped with Ag", Jul. 17, 1980, pp. K187–K190.

Hirose, et al., "Polarity–dependent memory switching and behavior of Ag dendrite in Ag–photodoped amorphous $As_2S_3$ films", Journal of Applied Physics, vol. 47, No. 6, Jun., 1976, pp. 2767–2772.

Kawaguchi, et al., "Optical, electrical, and structural properties of amorphous Ag–Ge–S and Ag–Ge–Se films and comparison of photoinduced and thermally induced phenomena of both systems", Journal of Applied Physics, 79, Jun. 1996, pp. 9096–9104.

Owens et al., Metal–Chalcogenide Photoresists for High Resolution Lithography and Sub–Micron Structures, Nanostructure Physics and Fabrication, pp. 447–451 (Academic Press, 1989).

Safran et al., TEM study of $Ag_2Se$ developed by the reaction of polycrystalline silver films and selenium, 317 Thin Solid Films, pp. 72–76 (1998).

Shimizu et al., The Photo–Erasable Memory Switching Effect of Ag Photo–Doped Chalcogenide Glasses, 46 Bul. Chem. Soc. Japan, No. 12, pp. 3662–3665 (Dec. 1973).

Kluge, et al., "Silver photodiffusion in amorphous $Ge_xSe_{100-x}$", Journal of Non–Crystalline Solids 124 (1990) pp. 186–193.

Kolobov, A.V., "Photodoping of amorphous chalcogenides by metals", Advances in Physics, 1991, vol. 40, No. 5, pp. 625–684.

Mitkova, et al. "Dual Chemical Role of Ag as an Additive in Chalcogenide Glasses", Physical Review Letters, Vo.. 83, No. 19, pp. 3848–3851.

Mitkova, "Insulating and Semiconducting Glasses", Editor: P. Boolchand, World Scientific, New Jersey, 2000, pp. 813–843.

Das et al., Theory of the characteristic curves of the silver chalcogenide glass inorganic photoresists, 54 Appl. Phys. Lett., No. 18, pp. 1745–1747 (May 1989).

Helbert et al., Intralevel hybrid resist process with submicron capability, SPIE vol. 333 Submicron Lithography pp. 24–29 (1982).

Hilt, Dissertation: Materials Characterization of Silver Chalcogenide Programmable Metallization Cells, Arizona State University, pp. title page–114 (UMI Company, May 1999).

Holmquist et al., Reaction and Diffusion in Silver–Arsenic Chalcogenide Glass Systems, 62 J. Amer. Ceramic Soc., Nos. 3–4, pp. 183–188 (Mar.–Apr. 1979).

Huggett et al., Development of silver sensitized germanium selenide photoresist by reactive sputter etching in $SF_6$, 42 Appl. Phys. Lett., No. 7, pp. 592–594 (Apr. 1983).

Kawaguchi et al., Mechanism of photosurface deposition, 164–166 J. Non–Cryst. Solids, pp. 1231–1234 (1993).

McHardy et al., The dissolution of metals in amorphous chalcogenides and the effects of electron and ultraviolet radiation, 20 J. Phys. C: Solid State Phys., pp. 4055–4075 (1987).

Miyatani, Electrical Porperties of $Ag_2Se$, 13 J. Phys. Soc. Japan, p. 317 (1958).

Mizusaki et al. Kinetic Studies on the Selenization of Silver, 47 Bul. Chem. Soc. Japan,, No. 11 pp. 2851–2855 (Nov. 1974).

Somogyi et al., Temperature Dependence of the Carrier Mobility in $Ag_2Se$ Layers Grown on NaCl and $SiO_x$ Substrates, 74 Acta Physica Hungarica, No. 3, pp. 243–255 (1994).

Tai et al., Multilevel Ge–Se film based resist systems, SPIE vol. 333 Submicron Lithography, pp. 32–39 (Mar. 1982).

Tai et al., Submicron optical lithography using an inorganic resist/polymer bilevel scheme, 17 J. Vac. Sci. Technol., No. 5, pp. 1169–1176 (Sep./Oct. 1980).

West, Dissertation: Electrically Erasable Non–Volatile Memory Via electrochemical Deposition of Multifractal Aggregates, Arizona State University, pp. title page–168 (UMI Co., May 1998).

West et al., Equivalent Circuit Modeling of the $Ag\backslash As_{0.24}S_{0.36}Ag_{0.40}\backslash Ag$ System Prepared by Photodissolution of Ag, 145 J. Electrochem. Soc., No. 9, pp. 2971–2974 (Sep. 1998).

Yoshikawa et al., A new inorganic electron resist of high contrast, 31 Appl. Phys. Lett., No. 3, pp. 161–163 (Aug. 1977).

Yoshikawa et al., Dry development of Se–Ge Inorganic photoresist, 36 Appl. Phys. Lett., No. 1, pp. 107–109 (Jan. 1980).

Axon Technologies Corporation, Technology Description: *Programmable Metallization Cell (PMC)*, pp. 1–6.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

D.B. Johnson, et al., "Lateral Diffusion in Ag–Se Thin–Film Couples", Journal of Applied Physics, vol. 40, No. 1, Jan. 1969, pp. 149–152.

Abdel–All, A.; Elshafie,A.; Elhawary, M.M., DC electric–field effect in bulk and thin–film Ge5As38Te57 chalcogenide glass, Vacuum 59 (2000) 845–853.

Alder, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.d.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4l5, Solid State Ionics 70/71 (1994) 72–76.

Booichand, P., The maximum in glass transition temperature (Tg) near x=1/3 in GexSe1–x Glasses, Asian Journal of Physics (2000) 9, 709–72.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy $Ge_xSe_{1-x}$ around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of $Ge_2S_3$, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Masui, K., Analysis of change in optical transmission spectra resulting from Ag photodoping in chalcogenide film, Japn. J. Appl. Phys. 26 (1987) 15–21.

Kawasakik, M.; Kawamura, J.; Nakamura, Y.; Aniya, M., Ionic conductivity of $Ag_x(GeSe_3)_{1-x}(0<=x<=0.571)$ glasses, Solid state Ionics 123 (1999) 259–269.

Kolobov, A.V., On the origin of p–type conductivity in amorphous calcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kittwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in $Ge_xSe_{1-x}$ glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–158.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in $(Ag_xCu_{1-x})_2Se$, J. Phys. Soc. Japan 34 (1973) 423–432.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D.; white, R.M. Electric field enhanced phase separation and memory switching in amorphous arsenic triselenide, Journal (??) (1972) 4609–4612.

* cited by examiner

RESISTANCE VARIABLE DEVICE

TECHNICAL FIELD

This invention relates to non-volatile resistance variable devices, to analog memory devices, to programmable memory cells, and to methods of forming such devices, to programming such devices and structurally changing such devices.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761, 115; 5,896,312; 5,914,893; and 6,084,796, which ultimately resulted from U.S. patent application Ser. No. 08/652,706, filed on May 30, 1996, disclosing what is referred to as a programmable metallization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a chemical and structural change at a certain applied voltage. Specifically, at some suitable threshold voltage, plating of metal from metal ions within the material begins to occur on the cathode and grows or progresses through the fast ion conductor toward the other anode electrode. With such voltage continued to be applied, the process continues until a single conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The highly conductive filament which forms between the illustrated electrodes in the fast ion conductor material tends to form at a surface thereof, as opposed to centrally within the mass of material. It has been discovered that defects on such surface somehow create an electrochemical path of least resistance along which the conductive filament during programming will form. Accordingly, the forming filament may serpentine along a path of least resistance at the peripheral edge surface of the material between the two electrodes, thereby resulting in variability in the amount of time it takes to program two devices of otherwise common dimensions. It would be desirable to develop structures and methods which overcome this write time variability.

While principally motivated utilizing the above-described circuitry and addressing the stated specific objective, the invention is in no way so limited. Rather, the invention is more broadly directed to any nonvolatile resistance variable devices, including methods of fabricating, programming and structurally changing the same, with the invention only being limited by the accompanying claims appropriately interpreted in accordance with the doctrine of equivalents.

SUMMARY

The invention comprises non-volatile resistance variable devices, analog memory devices, programmable memory cells, and methods of forming such devices, programming such devices and structurally changing such devices. In one implementation, a non-volatile resistance variable device includes a body formed of a voltage or current controlled resistance setable material, and at least two spaced electrodes on the body. The body includes a surface extending from one of the electrodes to the other of the electrodes. The surface has at least one surface striation extending from proximate the one electrode to proximate the other electrode at least when the body of said material is in a highest of selected resistance setable states.

In one implementation, a method includes structurally changing a non-volatile device having a body formed of a voltage or current controlled resistance setable material and at least two spaced electrodes on the body. The body has a surface extending from one of the electrodes to the other of the electrodes, and the surface is formed to comprise at least one surface striation extending from proximate the one electrode to proximate the other electrode. The method includes applying a first voltage between the one and the other electrodes to establish a negative and a positive electrode effective to form a conductive path formed of at least some material derived from the voltage or current controlled resistance setable material and on the surface along at least a portion of the at least one striation.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
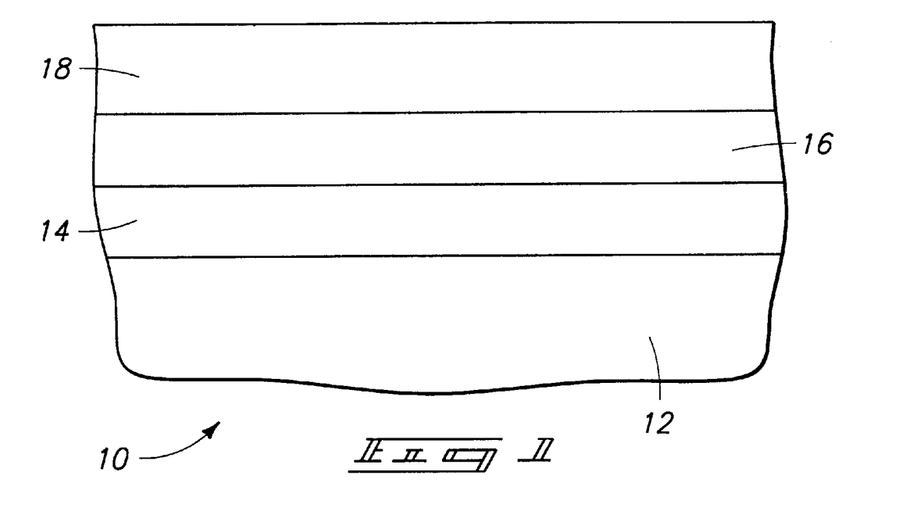
FIG. 1 is a diagrammatic sectional view of a semiconductor wafer fragment in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metallization cells and programmable optical elements of the patents referred to above, further by way of example only including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. Further by way of example only, the invention also contemplates forming nonvolatile resistance variable devices into an analog memory device capable of being set and reset to a resistance value over a continuous range of resistance values which is measure of a voltage applied to it over a corresponding range of voltage values. By way of example only, such are disclosed in U.S. Pat. No. 5,360,981, which resulted from a Ser. No. application 194,628, filed on May 4, 1990, listing Owen et al. as inventors. This '981 patent is fully herein incorporated by reference. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive s material layers (either alone or in assemblies comprising other materials). The term "substrate" refers to any supporting structure, including, but not limited to, the semiconductive substrates described above. Also in the context of this document, the term "layer" encompasses both the singular and the plural. Further, it will be appreciated by the artisan that "resistance setable semiconductive material" and "resistance variable device" includes materials and devices wherein a property or properties in addition to resistance is/are also varied. For example, and by way of example only, the material's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A conductive first electrode material 16 is formed over dielectric layer 14. By way of example only, preferred materials include any of those described in the incorporated Kozicki et al. and/or Owen et al. patents referred to above, in conjunction with the preferred type of device being fabricated. A dielectric layer 18 is formed over first electrode layer 16. Silicon nitride is a preferred example.

Figure 2:
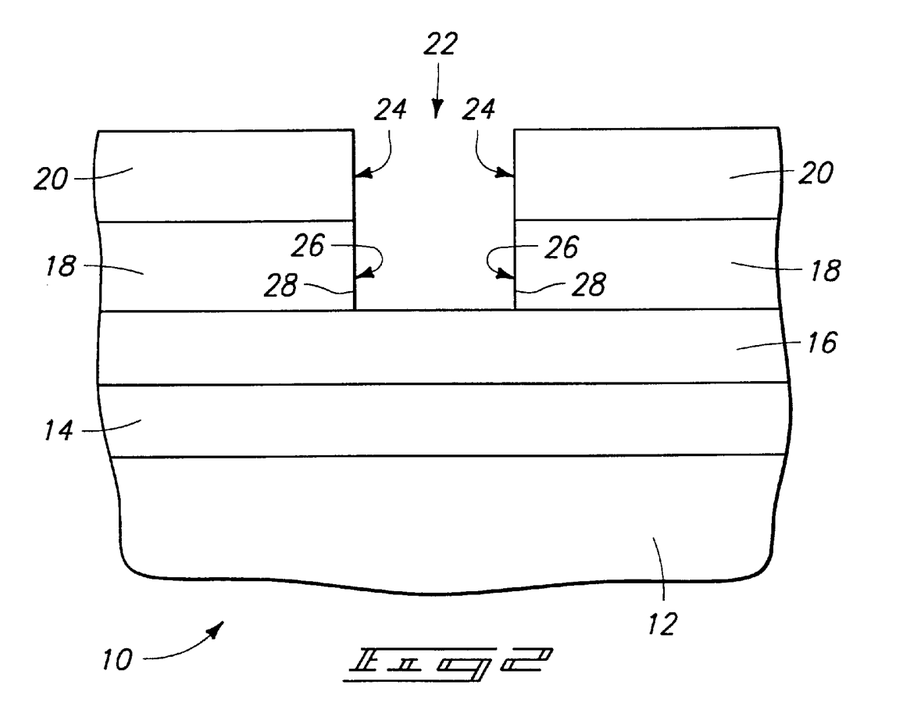
FIG. 2 is a view of the FIG. 1 wafer fragment at a processing step subsequent to that shown by FIG. 1, and taken relative to line 2—2 in FIG. 3.
Figure 3:
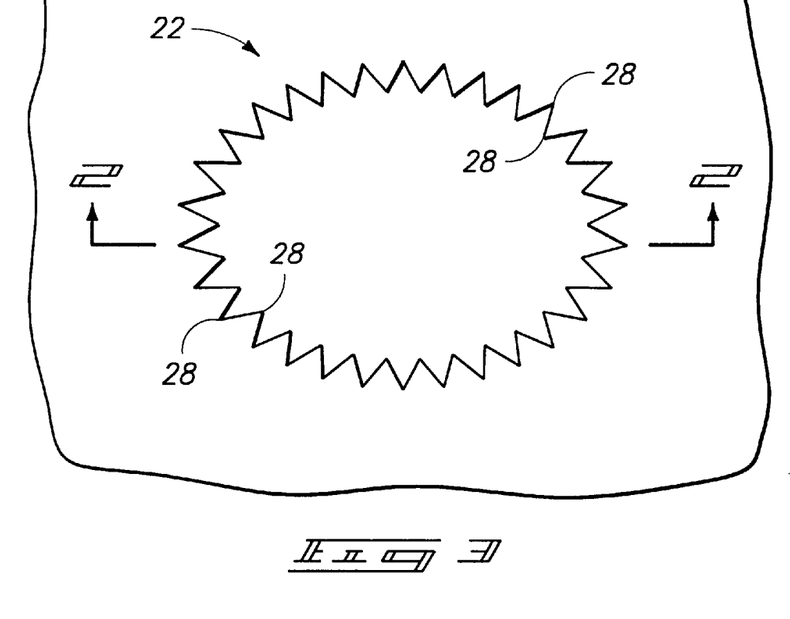
FIG. 3 is a diagrammatic top view of FIG. 2.

Referring to FIGS. 2 and 3, a masking layer 20, for example photoresist, is received over layer 18. An opening 22 is formed into masking layer 20 and dielectric layer 18 to first electrode layer 16. Opening 22 includes masking layer sidewalls 24 and dielectric layer sidewalls 26. Forming such opening is conducted in a manner which produces at least one surface striation 28 in at least a portion of opening sidewalls 26. Typically and preferably, a plurality of such surface striations 28 are formed, and preferably extend from proximate first electrode layer 14 along the substantial entirety of opening 22 within dielectric layer 18 to the outer surface thereof. Accordingly, in the most preferred embodiment, sidewall striations 28 extend in a substantially straight line, and preferably of least possible distance, from electrode layer 16 to the outermost surface of layer 18.

Most preferably, the forming of opening 22 within dielectric layer 18 is conducted by etching, and with sidewall striations 28 being formed during the initial dielectric layer 18 etching to form opening 22 therein. Alternately by way of example only, the manner of forming can comprise forming the at least one sidewall striation after dielectric layer 18 etching to initially form the opening and expose the electrode layer without significant striation forming therein. The illustrated and preferred manner comprises forming the at least one surface striation in sidewalls 24 of masking layer 20 which overlies dielectric layer 18, and thereafter etching into dielectric layer 18 to form opening 22 therein using masking layer 20 as an etching mask and thereby patterning the striations therefrom into opening 22 within layer 18.

Various techniques are known to the artisan for creating striations in a contact opening. By way of example only, such are disclosed in U.S. Pat. No. 5,238,862 to Blalock et al., filed on Mar. 18, 1992, and U.S. patent application Ser. No. 09/492,738, filed Jan. 27, 2000, entitled "Plasma Etching Methods", and listing Becker, Howard and Donahoe as inventors. These documents are herein fully incorporated by reference. The invention, of course, contemplates these and other striation-forming techniques, whether existing or yet-to-be developed.

Figure 4:
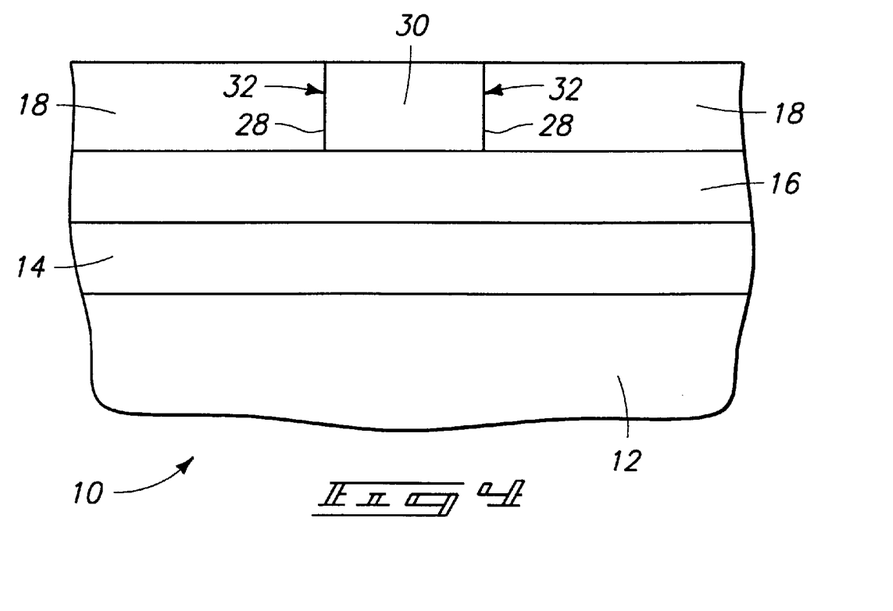
FIG. 4 is a view of the FIG. 1 wafer fragment at a processing step subsequent to that shown by FIG. 2.
Figure 5:
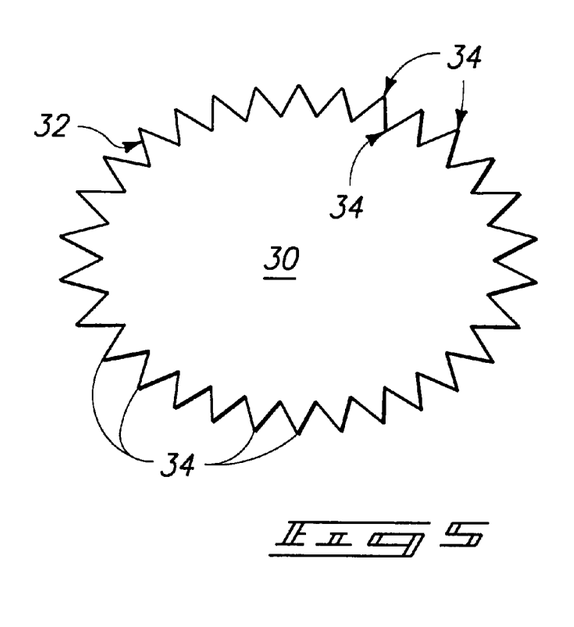
FIG. 5 is a diagrammatic top view of a portion of FIG. 4.

Referring to FIGS. 4 and 5, masking layer 20 has been removed and a voltage or current controlled resistance setable material is formed within opening 22 in layer 18 in electrical connection with first electrode layer 16. Example preferred materials include voltage or current controlled resistance setable semiconductive material, for example that disclosed in the Owen et al. patent referred to herein. Further, exemplary preferred material includes fast ion conductor material, such as metal ion-containing dielectric material or metal ion-containing semiconductive material, as disclosed in the Kozicki et al. patents referred to herein. Alternate materials are contemplated, of course, whether existing or yet-to-be developed. In the context of this document, voltage or current controlled resistance setable material includes any material whose resistance can be non-volatilely varied in at least some manner by application of different voltages or currents therethrough.

Preferably as shown, such material 30 is formed to have a surface 32 at least a portion of which extends along the dielectric layer striations 28 to form at least one surface striation 34 (FIG. 5) in the surface portion of material 30. In the preferred and illustrated embodiment, the at least one surface portion striation 32 is received on dielectric layer 18 and therefore contacts the same. In the preferred embodiment, material 30 is shown as having been planarized relative to dielectric layer 18.

Figure 6:
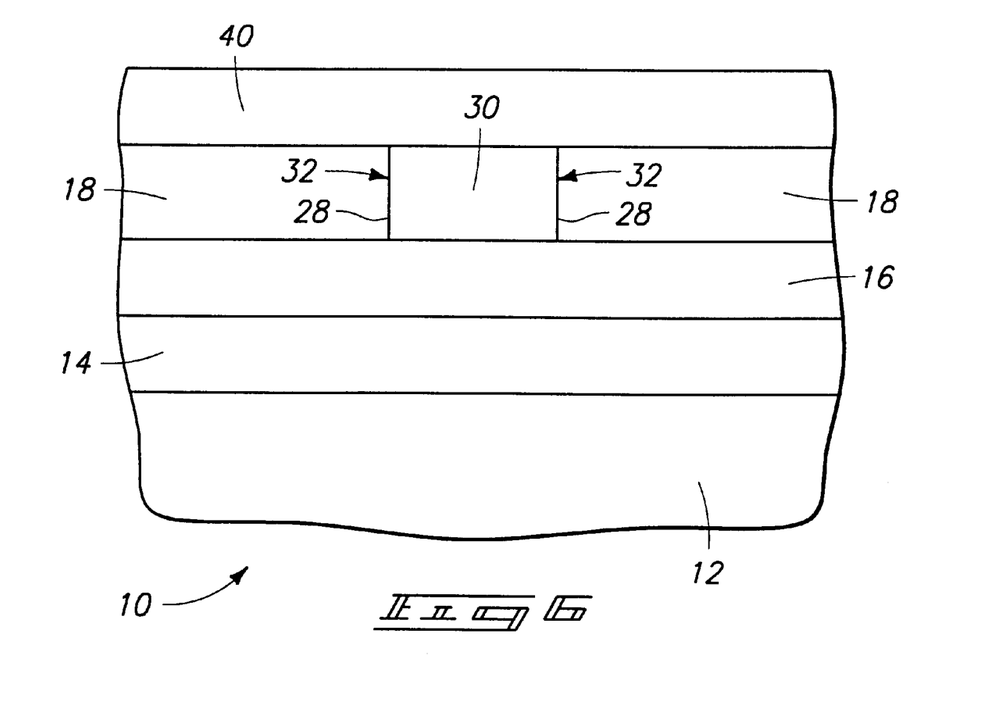
FIG. 6 is a view of the FIG. 1 wafer fragment at a processing step subsequent to that shown by FIG. 4.

Referring to FIG. 6, a second electrode layer 40 is formed in electrical connection with voltage or current controlled resistance setable material 30 within opening 22 of dielectric 18. Accordingly, striations 34 of material 30 in the most preferred embodiment extend from proximate first electrode 16 to proximate second electrode 40, and most preferably in a substantially straight line of least possible distance therebetween. FIG. 6 depicts, in structure and method, an exemplary body 30 of voltage or current controlled resistance setable material having at least two spaced electrodes 16 and 40 received thereon. The body comprises a surface extending from one of the electrodes to the other of the electrodes, with the surface being formed to comprise at least one surface striation extending from proximate the one electrode to proximate the other electrode, at least when the body of the material is in a highest of selected resistance states. FIG. 6 illustrates but one exemplary non-volatile resistance variable device, and a method of fabricating. Alternate methods and structures beyond that shown are, of course, contemplated. By way of example only, the various components could be laterally oriented relative to one another as opposed to successively deposited layers atop one another. Other orientations are, of course, contemplated.

The invention also contemplates methods of structurally changing a non-volatile device. The method comprises applying a first voltage between two electrodes to establish a negative and a positive electrode effective to form a conductive path formed of at least some material derived from voltage or current controlled resistance setable material received between the electrodes, and on the surface of such material along at least a portion of at least one striation formed therein. Such conductive path may extend partially between the electrodes, or alternately, entirely between the electrodes, effectively electrically shorting the electrodes together. The invention also comprises, after applying such first voltage, applying a second voltage opposite in polarity to the first voltage to reverse formation of the conductive path, either partially or entirely. The invention also comprises, after applying such first voltage, applying sufficiently high current to break the dendrite/filament. Exemplary techniques for accomplishing such are disclosed in the Kozicki et al. and Owen et al. patents.

The invention also contemplates fabrication and processing relative to analog memory devices capable of being set and reset to a resistance value over a continuous range of resistance values, which is a measure of a voltage or current applied to it over a corresponding range of voltage or current values. An example is described in the Owen et al. patent.

Figure 7:
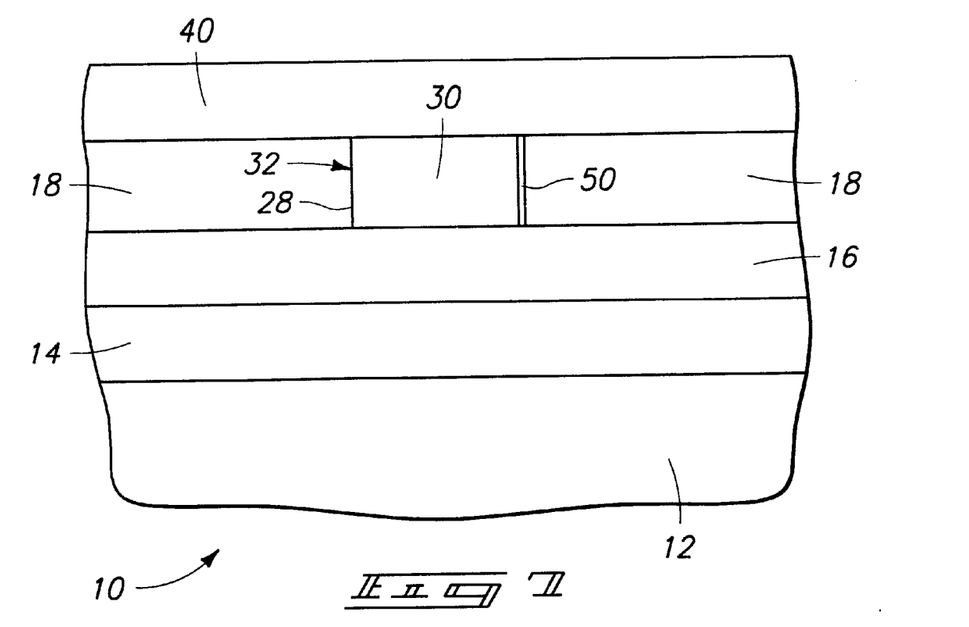
FIG. 7 is a view of the FIG. 1 wafer fragment at a processing step subsequent to that shown by FIG. 6.
Figure 8:
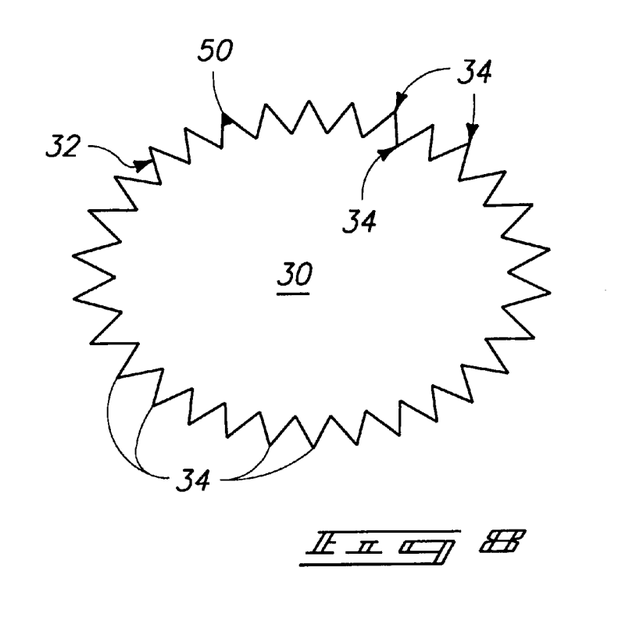
FIG. 8 is a diagrammatic top view of a portion of FIG. 7.
Figure 9:
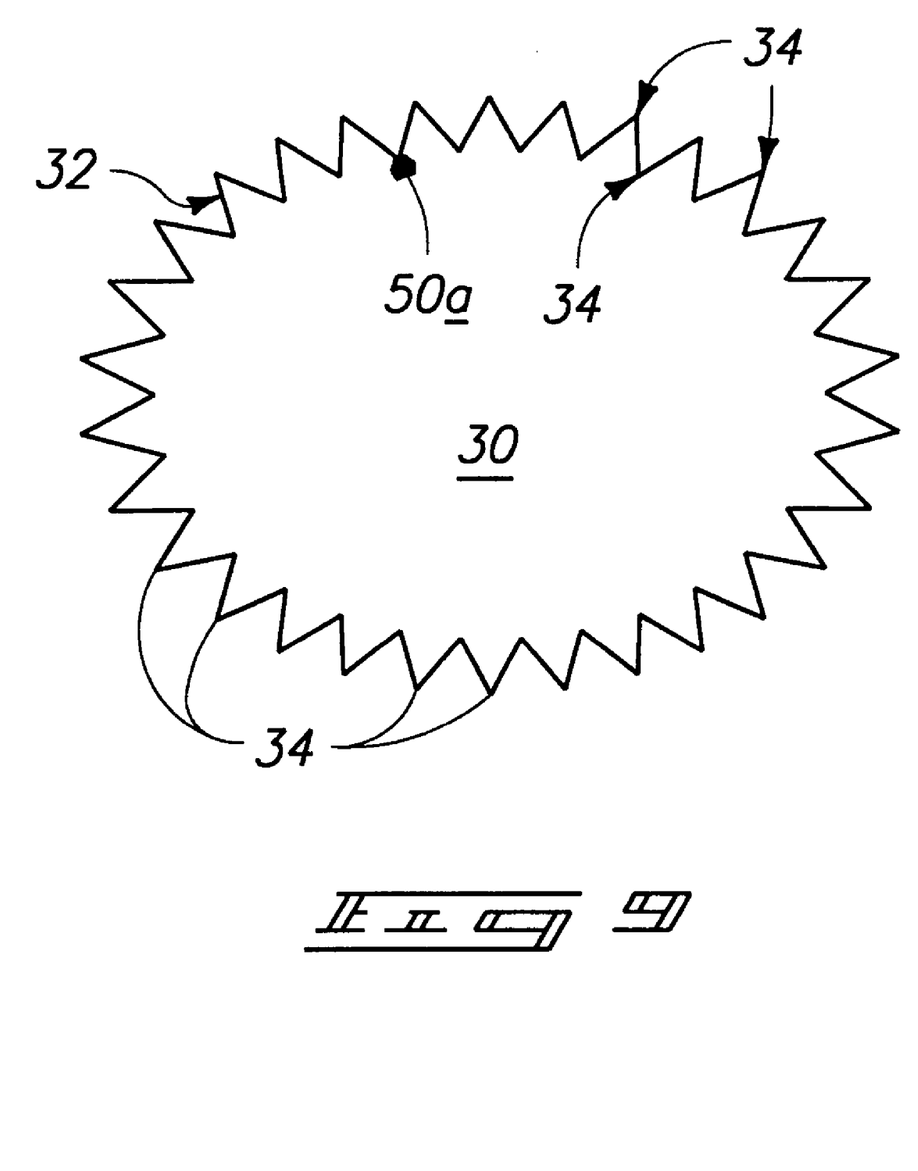
FIG. 9 is a diagrammatic top view like FIG. 8, but showing an alternate embodiment from that of FIG. 8.

FIGS. 7, 8 and 9 illustrate exemplary embodiments involving programming or otherwise formation of a conductive path between the electrodes. For example, FIGS. 7 and 8 illustrate a conductive path/dendrite 50 being formed in the sidewall portion of material 20 along an apex form of a striation 34. FIG. 9 illustrates an alternate embodiment wherein a conductive path/dendrite 50*a* forms at and along a valley portion of a striation 34. The invention also contemplates formation of a conductive path/dendrite anywhere along the surface between path 50 of FIG. 8 and path 50*a* of FIG. 9.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a resistance variable device, comprising:

forming a first electrode over a substrate;

forming a dielectric layer over the first electrode;

forming an opening having sidewalls into the dielectric layer to the first electrode in a manner which produces at least one surface striation in at least a portion of the opening sidewalls;

forming voltage or current controlled resistance setable semiconductive material within the opening in electrical connection with the first electrode, said material having a surface at least a portion of which extends along the at least one dielectric layer striation to form at least one surface striation in the surface portion; and forming a second electrode in electrical connection with the voltage or current controlled resistance setable semiconductive material received within the opening.

2. The method of claim 1 comprising forming the resistance variable device into a programmable memory cell of memory circuitry.

3. The method of claim 1 comprising forming the resistance variable device into an antifuse of integrated circuitry.

4. The method of claim 1 comprising forming the resistance variable device into a programmable resistance element of integrated circuitry.

5. The method of claim 1 comprising forming the resistance variable device into a programmable capacitance element of integrated circuitry.

6. The method of claim 1 comprising forming the resistance variable device into a programmable optical element of integrated circuitry.

7. The method of claim 1 comprising forming the resistance variable device into a programmable metallization cell.

8. The method of claim 1 comprising forming the resistance variable device into an analog memory device capable of being set and reset to a resistance value over a continuous range of resistance values which is a measure of a voltage applied to it over a corresponding range of voltage values.

9. The method of claim 1 comprising forming a plurality of the surface striations in the opening sidewalls and the surface portion.

10. The method of claim 1 comprising forming the at least one sidewall striation and the at least one surface portion striation to extend from proximate the first electrode to proximate the second electrode.

11. The method of claim 1 comprising forming the at least one sidewall striation and the at least one surface portion striation to extend in a substantially straight line.

12. The method of claim 1 comprising forming the at least one sidewall striation and the at least one surface portion striation to extend in a substantially straight line from proximate the first electrode to proximate the second electrode.

13. The method of claim 1 comprising forming the at least one sidewall striation and the at least one surface portion striation to extend in a substantially straight line of least possible distance from proximate the first electrode to proximate the second electrode.

14. The method of claim 1 comprising forming the at least one surface portion striation to contact the dielectric layer.

15. The method of claim 1 wherein the forming of the opening in the dielectric layer comprises etching, the manner comprises forming at least one surface striation in a sidewall of a masking layer opening overlying the dielectric layer, and etching into the dielectric layer to form the dielectric layer opening using the masking layer as an etching mask.

16. The method of claim 1 wherein the forming of the opening in the dielectric layer comprises etching, and the manner comprises forming the at least one sidewall striation during initial dielectric layer etching to form the opening.

17. The method of claim 1 wherein the forming of the opening in the dielectric layer comprises etching, and the manner comprises forming the at least one sidewall striation after dielectric layer etching to the first electrode.

18. A method of forming a resistance variable device, comprising:
   forming a first electrode over a substrate;
   forming a dielectric layer over the first electrode;
   forming an opening having sidewalls into the dielectric layer to the first electrode in a manner which produces at least one surface striation in at least a portion of the opening sidewalls;
   forming a fast ion conductor material within the opening in electrical connection with the first electrode, said material having a surface at least a portion of which extends along the at least one dielectric layer striation to form at least one surface striation in the surface portion; and
   forming a second electrode in electrical connection with the fast ion conductor material received within the opening.

19. The method of claim 18 wherein the fast ion conductor material comprises metal ion-containing dielectric material.

20. The method of claim 18 wherein the fast ion conductor material comprises metal ion-containing semiconductive material.

21. The method of claim 18 comprising forming a plurality of the surface striations in the opening sidewalls and the surface portion.

22. The method of claim 18 comprising forming the at least one sidewall striation and the at least one surface portion striation to extend from proximate the first electrode to proximate the second electrode.

23. The method of claim 18 comprising forming the at least one sidewall striation and the at least one surface portion striation to extend in a substantially straight line.

24. The method of claim 18 comprising forming the at least one sidewall striation and the at least one surface portion striation to extend in a substantially straight line from proximate the first electrode to proximate the second electrode.

25. The method of claim 18 comprising forming the at least one sidewall striation and the at least one surface portion striation to extend in a substantially straight line of least possible distance from proximate the first electrode to proximate the second electrode.

26. The method of claim 18 comprising forming the at least one surface portion striation to contact the dielectric layer.

27. The method of claim 18 wherein the forming of the opening in the dielectric layer comprises etching, the manner comprises forming at least one surface striation in a sidewall of a masking layer opening overlying the dielectric layer, and etching into the dielectric layer to form the dielectric layer opening using the masking layer as an etching mask.

28. The method of claim 18 wherein the forming of the opening in the dielectric layer comprises etching, and the manner comprises forming the at least one sidewall striation during initial dielectric layer etching to form the opening.

29. The method of claim 18 wherein the forming of the opening in the dielectric layer comprises etching, and the manner comprises forming the at least one sidewall striation after dielectric layer etching to the first electrode.

30. A method of forming an analog memory device capable of being set and reset to a resistance value over a continuous range of resistance values which is a measure of a voltage applied to it over a corresponding range of voltage values, said method comprising:
   forming a first electrode over a substrate;
   forming a dielectric layer over the first electrode;
   forming an opening having sidewalls into the dielectric layer to the first electrode in a manner which produces at least one surface striation in at least a portion of the opening sidewalls;
   forming a material exhibiting said range of resistance values within the opening in electrical connection with the first electrode, said material having a surface at least a portion of which extends along the at least one dielectric layer striation to form at least one surface striation in the surface portion; and
   forming a second electrode in electrical connection with the voltage or current controlled resistance setable semiconductive material received within the opening.

31. The method of claim 30 comprising forming the at least one sidewall striation and the at least one surface portion striation to extend from proximate the first electrode to proximate the second electrode.

32. The method of claim 30 comprising forming the at least one sidewall striation and the at least one surface portion striation to extend in a substantially straight line.

33. The method of claim 30 comprising forming the at least one sidewall striation and the at least one surface portion striation to extend in a substantially straight line from proximate the first electrode to proximate the second electrode.

34. A method of forming a programmable memory cell comprising providing a body formed of a voltage or current controlled resistance setable material, and providing at least two spaced electrodes on the body, the body comprising a surface extending from one of the electrodes to the other of the electrodes, the surface being formed to comprise at least one surface striation extending from proximate the one electrode to proximate the other electrode at least when the body of said material is in a highest of selected resistance setable states.

35. The method of claim 34 wherein the voltage or current controlled resistance setable material comprises semiconductive material.

36. The method of claim 34 wherein the voltage or current controlled resistance setable material comprises metal ion-containing semiconductive material.

37. The method of claim 34 wherein the voltage or current controlled resistance setable material comprises metal ion-containing dielectric material.

38. The method of claim 34 comprising forming the at least one striation to extend in a substantially straight line.

39. The method of claim 34 comprising forming the at least one striation to extend in a substantially straight line of least possible distance from proximate the one electrode to proximate the other electrode.

40. A method of forming a resistance variable device comprising providing a body formed of a voltage or current controlled resistance setable material, and providing at least two spaced electrodes on the body, the body comprising a surface extending from one of the electrodes to the other of the electrodes, the surface being formed to comprise at least one surface striation extending from proximate the one electrode to proximate the other electrode at least when the body of said material is in a highest of selected resistance setable states.

41. The method of claim 40 wherein the voltage or current controlled resistance setable material comprises semiconductive material.

42. The method of claim 40 wherein the voltage or current controlled resistance setable material comprises metal ion-containing semiconductive material.

43. The method of claim 40 wherein the voltage or current controlled resistance setable material comprises metal ion-containing dielectric material.

44. The method of claim 40 comprising forming the at least one striation to extend in a substantially straight line.

45. The method of claim 40 comprising forming the at least one striation to extend in a substantially straight line of least possible distance from proximate the one electrode to proximate the other electrode.

46. A method of structurally changing a device having a body formed of a voltage or current controlled resistance setable material and at least two spaced electrodes on the body, with the body comprising a surface extending from one of the electrodes to the other of the electrodes, and with the surface being formed to comprise at least one surface striation extending from proximate the one electrode to proximate the other electrode, the method comprising applying a first voltage between the one and the other electrodes to establish a negative and a positive electrode effective to form a conductive path formed of at least some material derived from the voltage or current controlled resistance setable material and on the surface along at least a portion of the at least one striation.

47. The method of claim 46 comprising after applying the first voltage, applying a second voltage opposite in polarity to the first voltage to reverse formation of the conductive path.

48. The method of claim 46 comprising after applying the first voltage, applying a sufficiently high current to break the conductive path.

49. A method of shorting a device having a body formed of a voltage or current controlled resistance setable material and at least two spaced electrodes on the body, with the body comprising a surface extending from one of the electrodes to the other of the electrodes, and with the surface being formed to comprise at least one surface striation extending from proximate the one electrode to proximate the other electrode, the method comprising applying a first voltage between the one and the other electrodes to establish a negative and a positive electrode effective to form a conductive path formed of at least some material derived from the voltage or current controlled resistance setable material and on the surface along the at least one striation effective to electrically short the one and the other electrodes.

50. The method of claim 49 comprising after applying the first voltage, applying a second voltage opposite in polarity to the first voltage to reverse formation of the conductive path.

51. The method of claim 49 comprising after applying the first voltage, applying a sufficiently high current to break the conductive path.

* * * * *